United States Patent
Do et al.

(10) Patent No.: US 9,190,349 B1
(45) Date of Patent: Nov. 17, 2015

(54) INTEGRATED CIRCUIT PACKAGING SYSTEM WITH LEADFRAME AND METHOD OF MANUFACTURE THEREOF

(71) Applicants: Byung Tai Do, Singapore (SG); Arnel Senosa Trasporto, Singapore (SG); Linda Pei Ee Chua, Singapore (SG); Asri Yusof, Singapore (SG)

(72) Inventors: Byung Tai Do, Singapore (SG); Arnel Senosa Trasporto, Singapore (SG); Linda Pei Ee Chua, Singapore (SG); Asri Yusof, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 21 days.

(21) Appl. No.: 13/930,261

(22) Filed: Jun. 28, 2013

(51) Int. Cl.
- *H01L 21/00* (2006.01)
- *H01L 23/28* (2006.01)
- *H01L 23/495* (2006.01)
- *H01L 23/00* (2006.01)

(52) U.S. Cl.
CPC .......... *H01L 23/49517* (2013.01); *H01L 24/81* (2013.01)

(58) Field of Classification Search
CPC .................................. H01L 21/56; H01L 23/28
See application file for complete search history.

(56) References Cited

U.S. PATENT DOCUMENTS

| | | | |
|---|---|---|---|
| 6,255,740 B1 * | 7/2001 | Tsuji et al. | 257/792 |
| 6,964,918 B1 | 11/2005 | Fan et al. | |
| 7,232,755 B1 | 6/2007 | McLellan et al. | |
| 7,662,672 B2 | 2/2010 | Lin | |
| 7,741,149 B2 | 6/2010 | Qiao et al. | |
| 8,129,229 B1 | 3/2012 | Sirinorakul et al. | |
| 8,455,304 B2 | 6/2013 | Lam | |
| 8,987,060 B2 | 3/2015 | Yen | |
| 2005/0199995 A1 | 9/2005 | Nomoto et al. | |
| 2009/0302445 A1 | 12/2009 | Pagaila et al. | |
| 2011/0074026 A1 * | 3/2011 | Shim et al. | 257/737 |
| 2011/0079885 A1 | 4/2011 | Camacho et al. | |
| 2011/0227211 A1 | 9/2011 | Camacho et al. | |
| 2012/0007234 A1 | 1/2012 | Tsai et al. | |
| 2012/0139104 A1 | 6/2012 | Camacho et al. | |
| 2012/0146200 A1 | 6/2012 | McMillan et al. | |
| 2012/0181680 A1 | 7/2012 | Li | |
| 2012/0205811 A1 | 8/2012 | Do et al. | |
| 2012/0241973 A1 | 9/2012 | Chua et al. | |
| 2012/0280376 A1 | 11/2012 | Do et al. | |
| 2012/0280377 A1 | 11/2012 | Do et al. | |
| 2012/0280407 A1 | 11/2012 | Do et al. | |
| 2013/0154072 A1 | 6/2013 | Do et al. | |
| 2013/0154119 A1 | 6/2013 | Do et al. | |
| 2013/0256861 A1 | 10/2013 | Do et al. | |
| 2014/0008774 A1 | 1/2014 | Do et al. | |

(Continued)

OTHER PUBLICATIONS

U.S. Appl. No. 13/930,287, filed Jun. 28, 2013, Dimaculangan et al.
U.S. Appl. No. 13/930,319, filed Jun. 28, 2013, Do et al.

*Primary Examiner* — Whitney T Moore
*Assistant Examiner* — Joseph Galvin, III
(74) *Attorney, Agent, or Firm* — Ishimaru & Associates LLP

(57) ABSTRACT

An integrated circuit packaging system and method of manufacture thereof including: providing an unplated leadframe having a contact protrusion; depositing a solder resist on the contact protrusion; forming a contact pad and traces by etching the unplated leadframe; applying a trace protection layer on the contact pad and the traces; removing the solder resist; forming a recess in the trace protection layer by etching a top surface of the contact pad to a recess distance below a top surface of the trace protection layer; and depositing an external connector directly on the top surface of the contact pad.

20 Claims, 7 Drawing Sheets

(56) References Cited

U.S. PATENT DOCUMENTS

2014/0165389 A1 6/2014 Do et al.
2014/0167236 A1 6/2014 Do et al.
2015/0084172 A1 3/2015 Do et al.

* cited by examiner

INTEGRATED CIRCUIT PACKAGING SYSTEM WITH LEADFRAME AND METHOD OF MANUFACTURE THEREOF

CROSS-REFERENCE TO RELATED APPLICATION(S)

The present application contains subject matter related to concurrently filed U.S. patent application Ser. No. 13/930,287. The related application is assigned to STATS ChipPAC Ltd., and the subject matter thereof is incorporated in its entirety herein by reference thereto.

The present application contains subject matter related to concurrently filed U.S. patent application Ser. No. 13/930,319. The related application is assigned to STATS ChipPAC Ltd., and the subject matter thereof is incorporated in its entirety herein by reference thereto.

TECHNICAL FIELD

The present invention relates generally to an integrated circuit packaging system, and more particularly to a system formed from a leadframe.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In general, a leadframe will come from a supplier pre-plated with a desired pattern for further processing. The plating can protect selected portions of the leadframe during processing steps, but the plating itself uses relatively expensive materials, and under certain conditions it may be desirable to remove the plating. The die and portions of the leadframe are encapsulated with a molding material to protect the delicate electrical components on the active side of the die while leaving selected portions of the leadframe exposed to facilitate electrical connection to external devices.

Thus, a need still remains for a better manufacturing system. In view of the rising costs of materials, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an unplated leadframe having a contact protrusion; depositing a solder resist on the contact protrusion; forming a contact pad and traces by etching the unplated leadframe; applying a trace protection layer on the contact pad and the traces; removing the solder resist; forming a recess in the trace protection layer by etching a top surface of the contact pad to a recess distance below a top surface of the trace protection layer; and depositing an external connector directly on the top surface of the contact pad.

The present invention provides an integrated circuit packaging system, including: a contact pad; traces connected to the contact pad; a trace protection layer on the contact pad and the traces, the trace protection layer having a recess with a top surface of the contact pad a recess distance below a top surface of the trace protection layer; and an external connector directly on the top surface of the contact pad.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
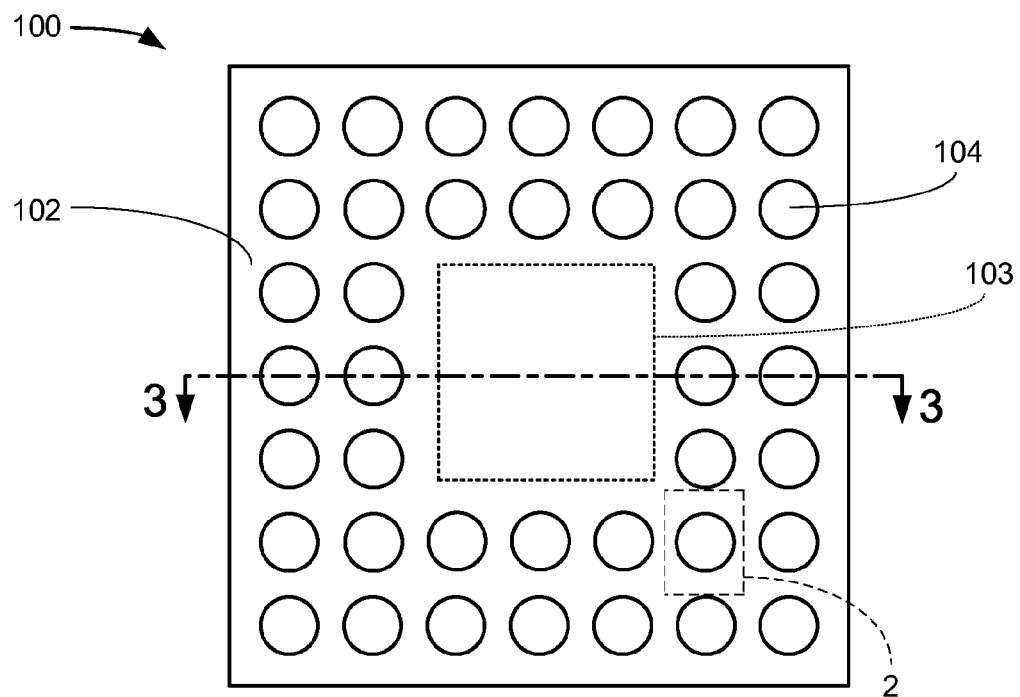
FIG. 1 is a bottom view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

The same numbers are used in all the drawing FIGS. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the contact pad, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in an embodiment of the present invention. The bottom view shows a trace protection layer 102 and external connectors 104. An integrated circuit die 103 is shown with a dotted square. The integrated circuit die 103 can be connected to the external connectors through internal connectors (not shown). The integrated circuit die 103 is shown as centrally located and of a particular size, though it is understood that this is for illustrative purposes only, and the integrated circuit die 103 can be larger, smaller, or located in an offset position.

The trace protection layer 102 protects and holds traces and contacts in place, and can be made from a material such as epoxy molding compound, resin, moldable underfill, a curable compound, or other non-conductive material. The trace protection layer 102 is shown as opaque, but it is understood that a translucent or transparent material may be used.

The external connectors 104, such as solder balls, can be connected to contact pads through the trace protection layer 102. The external connectors 104 function to electrically connect the integrated circuit die 103 to the outside of the integrated circuit packaging system 100.

Figure 2:
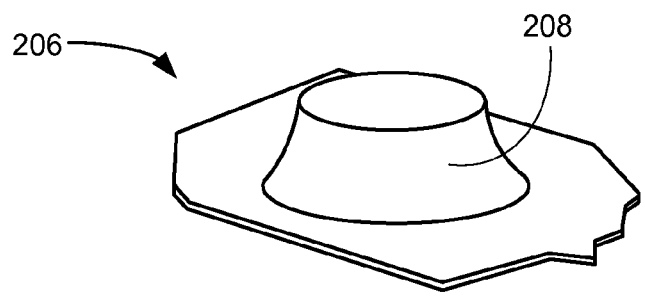
FIG. 2 is a detailed isometric view of FIG. 1 within the inset depicted by the dotted rectangle 2 of FIG. 1 in a beginning phase of manufacture.

Referring now to FIG. 2, therein is shown a detailed isometric view of FIG. 1 within the inset depicted by the dotted rectangle 2 of FIG. 1 in a beginning phase of manufacture. The detailed view shows a portion of an unplated leadframe 206 having one of many contact protrusions 208. The one of many contact protrusions 208 is shown as an example, and it is understood that each of the contact protrusions 208 present in the unplated leadframe 206 undergo the same processing.

The unplated leadframe 206 can be pre-stamped or pre-etched metal, such as copper, such that the contact protrusions 208 of the unplated leadframe 206 can function as contact pads after further processing. The contact protrusions 208 can have curved sides as a result of an etching process. The contact protrusions 208 can be formed by etching through most or half of the thickness of the unplated leadframe 206. Notably, the unplated leadframe 206 enters the manufacturing process without being pre-plated with metals such as nickel, palladium, or gold.

The unplated leadframe 206 has the integrated circuit die 103 connected to the contact protrusions 208 on bottom of the unplated leadframe 206, on the side of the contact protrusions 208 not visible in FIG. 2. The integrated circuit die 103 can be connected through internal connectors (not shown) such as solder balls, conductive posts, wire bonds, or a combination thereof.

It has been discovered that using the unplated leadframe 206 without pre-plated material can reduce cost, decrease product lead time, and increase etch efficiency. Avoiding the use of expensive plating materials as an etch stop can increase efficiency because a time-consuming removal process can be avoided. When forming a package having recessed contact pads, pre-plated material adds unnecessary steps, and therefore using the unplated leadframe 206 without pre-plated material increases production efficiency.

Figure 3A:
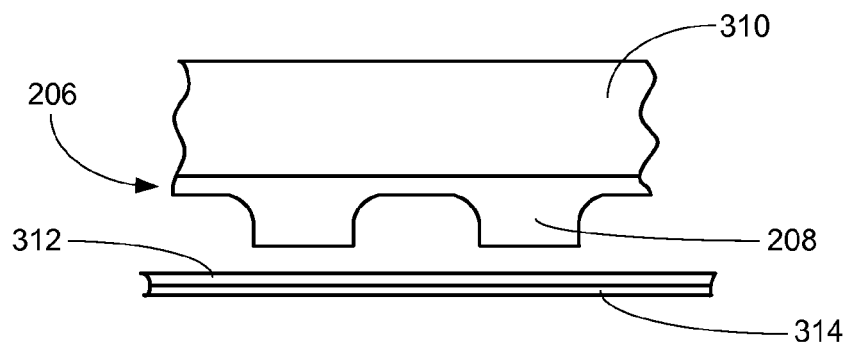
FIG. 3A is a partial cross-sectional view of the unplated leadframe exemplified by the section line 3-3 of FIG. 1 in a solder resist coating phase of manufacture.

Referring now to FIG. 3A, therein is shown a partial cross-sectional view of the unplated leadframe 206 exemplified by the section line 3-3 of FIG. 1 in a solder resist coating phase of manufacture. In this view is shown an encapsulation 310 covering one side of a portion of the unplated leadframe 206 on which the integrated circuit die 103 of FIG. 1 is attached, leaving the contact protrusions 208 exposed. The orientation is reversed compared to FIG. 2, and two of the contact protrusions 208 are shown. The unplated leadframe 206 is shown over solder resist 312 which has been prepared for a dipping process and on top of a dipping surface 314.

The solder resist 312 can be prepared as a viscous liquid or coat material that can be applied onto a flat surface, using a squeegee, for example. The layer of the solder resist 312 acts as a dipping area.

Figure 3B:
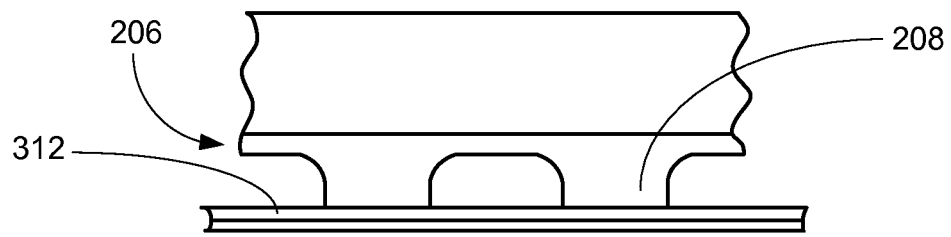
FIG. 3B is the structure of FIG. 3A in a dipping phase of manufacture.

Referring now to FIG. 3B, therein is shown the structure of FIG. 3A in a dipping phase of manufacture. In this view, the unplated leadframe 206 has been lowered to put the contact protrusions 208 in contact with the solder resist 312, which adheres to the surface of the contact protrusions 208.

Figure 3C:
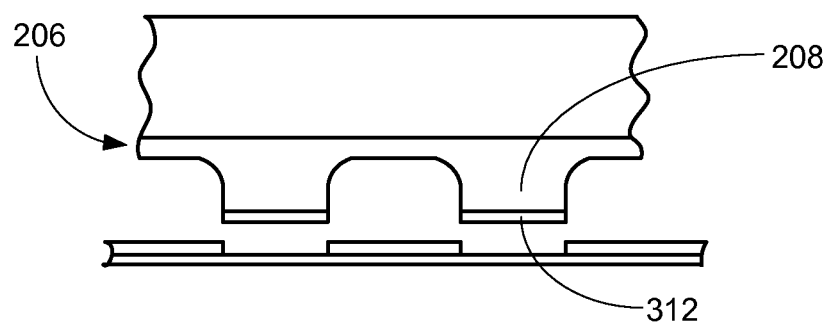
FIG. 3C is the structure of FIG. 3B in the dipping phase of manufacture.

Referring now to FIG. 3C, therein is shown the structure of FIG. 3B in the dipping phase of manufacture. After lowering the unplated leadframe 206 into the solder resist 312, the unplated leadframe 206 is raised, leaving the surface of the contact protrusions 208 coated with the solder resist 312. If necessary, a curing or hardening process follows the dipping phase in order to ensure the solder resist 312 stays on the contact protrusions 208.

Figure 4A:
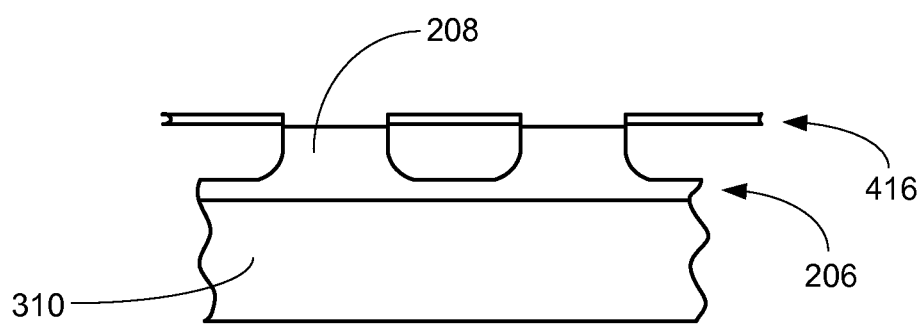
FIG. 4A is a partial cross-sectional view of the unplated leadframe exemplified by the section line 3-3 of FIG. 1 in an alternative solder resist coating phase of manufacture.

Referring now to FIG. 4A, therein is shown a partial cross-sectional view of the unplated leadframe 206 exemplified by the section line 3-3 of FIG. 1 in an alternative solder resist coating phase of manufacture. In this view is shown the encapsulation 310 covering one side of a portion of the unplated leadframe 206 on which the integrated circuit die 103 of FIG. 1 is attached, leaving the contact protrusions 208 exposed. A patterned screen 416 such as a screen, mask, or stencil, is shown over the unplated leadframe 206, patterned to have openings which leave a top surface of the contact protrusions 208 exposed through the patterned screen 416.

Figure 4B:
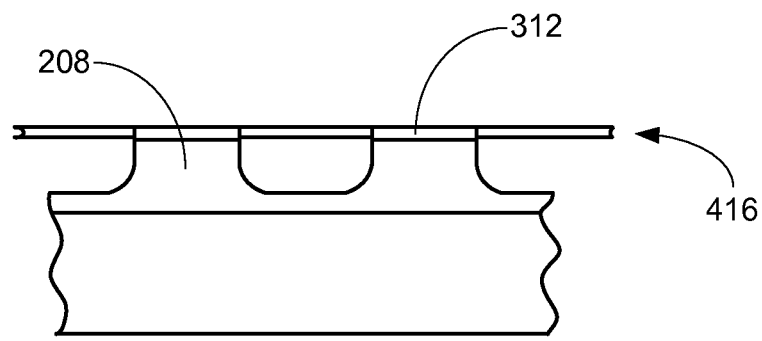
FIG. 4B is the structure of FIG. 4A in a screen printing phase of manufacture.

Referring now to FIG. 4B, therein is shown the structure of FIG. 4A in a screen printing phase of manufacture. The solder resist 312 is spread over the patterned screen 416, filling in the openings, and coating the top surface of the contact protrusions 208. This is followed by removal of any excess amount of the solder resist 312.

Figure 4C:
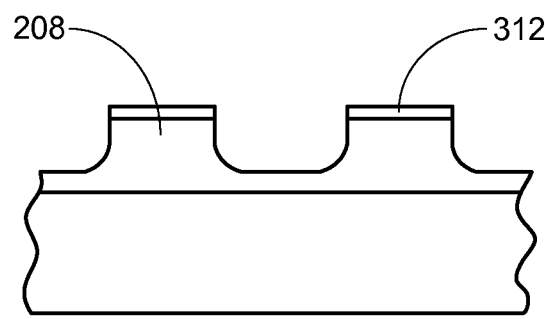
FIG. 4C is the structure of FIG. 4B in the screen printing phase of manufacture.

Referring now to FIG. 4C, therein is shown the structure of FIG. 4B in the screen printing phase of manufacture. After the excess amount of the solder resist 312 is removed, the patterned screen 416 of FIG. 4A is also removed, leaving only the top surface of the contact protrusions 208 covered in the solder resist 312.

Figure 5A:
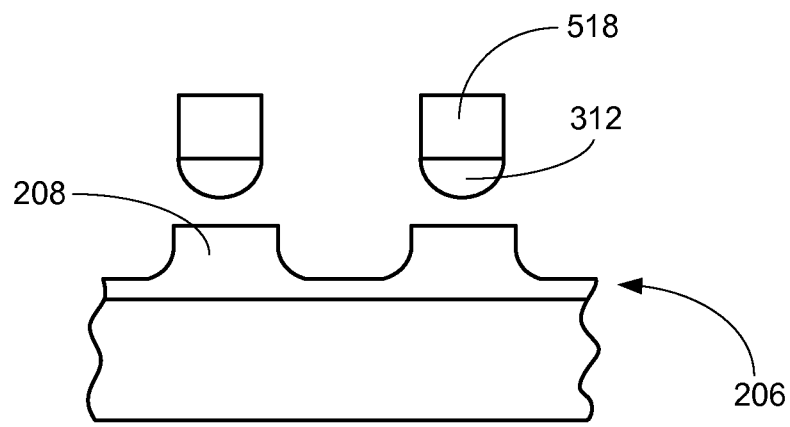
FIG. 5A is a partial cross-sectional view of the unplated leadframe exemplified by the section line 3-3 of FIG. 1 in another alternative solder resist coating phase of manufacture.

Referring now to FIG. 5A, therein is shown a partial cross-sectional view of the unplated leadframe 206 exemplified by the section line 3-3 of FIG. 1 in another alternative solder resist coating phase of manufacture. In this view is shown a structure just like FIG. 4A, except instead of the patterned screen 416 of FIG. 4A, coating pins 518 are shown above the contact protrusions 208. The coating pins 518 are arranged and positioned to match the arrangement of the contact protrusions 208, and are pre-coated with the solder resist 312. Only a portion of the coating pins 518 are shown.

Figure 5B:
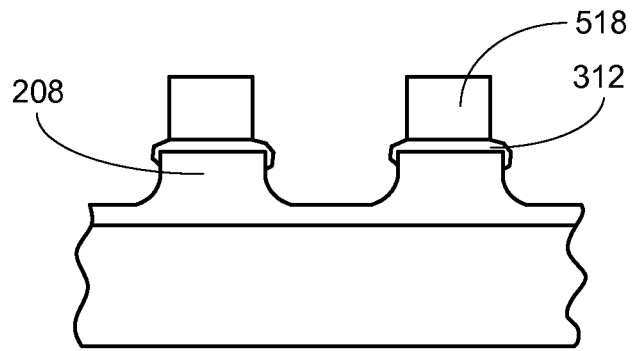
FIG. 5B is the structure of FIG. 5A in a pin transfer phase of manufacture.

Referring now to FIG. 5B, therein is shown the structure of FIG. 5A in a pin transfer phase of manufacture. The coating pins 518 are pressed towards the contact protrusions 208, spreading the solder resist 312 on the top surface of the contact protrusions 208. The physical contact can be accompanied by a heating step or other process to ensure release of the solder resist 312 from the coating pins 518.

In this example, the solder resist 312 is shown partially spreading down sides of the contact protrusions 208. In order to ensure full coverage of the top surface of the contact protrusions 208, more solder resist 312 than absolutely necessary can be used, leading to excess amounts of the solder resist 312 overflowing down the sides of the contact protrusions 208. However, it is understood that the pin transfer can be more precisely controlled so that there is not an excess amount of the solder resist 312 such that the solder resist 312 can cover only the top surface of the contact protrusions 208.

Figure 5C:
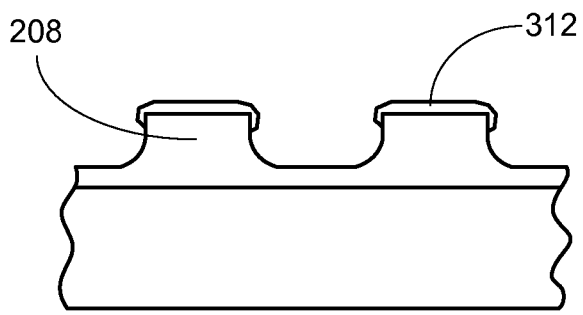
FIG. 5C is the structure of FIG. 5B in a pin transfer phase of manufacture.

Referring now to FIG. 5C, therein is shown the structure of FIG. 5B in a pin transfer phase of manufacture. In this step, the coating pins 518 of FIG. 5A have been removed, leaving the solder resist 312 on the top surface of the contact protrusions 208.

Figure 5D:
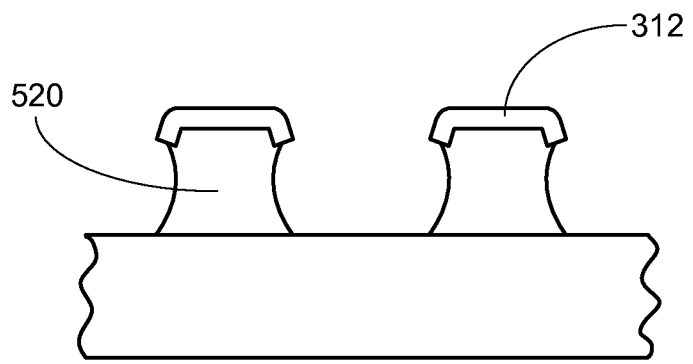
FIG. 5D is the structure of FIG. 5C in an etching phase of manufacture.

Referring now to FIG. 5D, therein is shown the structure of FIG. 5C in an etching phase of manufacture. Following the removal of the coating pins 518 of FIG. 5A, the unplated leadframe 206 of FIG. 2 is masked and etched to remove material from the contact protrusions 208 to form contact pads 520, which are electrically isolated from each other, while also forming traces for routing. The etching process can etch away a portion of the sides of the contact protrusions 208, forming the contact pads 520, such that the solder resist 312 overhangs the edge of the contact pads 520, which are smaller in diameter as compared to the contact protrusions 208 as a result of the etching process.

Figure 6:
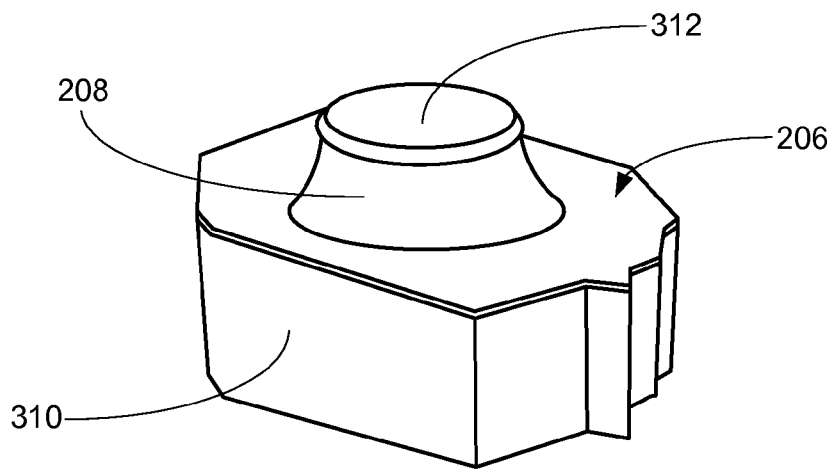
FIG. 6 is the structure of FIG. 2 in a solder resist coating phase of manufacture.

Referring now to FIG. 6, therein is shown the structure of FIG. 2 in a solder resist coating phase of manufacture. This isometric view shows the encapsulation 310 covering one side of the unplated leadframe 206 on which the integrated circuit die 103 of FIG. 1 is attached, leaving the other side of the unplated leadframe 206 and the contact protrusions 208 exposed from the encapsulation 310. One of the contact protrusions 208 is shown, though it is understood that there are more of the contact protrusions 208. The top surface of the contact protrusions 208 is covered by the solder resist 312 which can be applied through a process such as dipping, screen printing, or pin transfer, as described above. The solder resist 312 has a thickness sufficient to have sides visible in this view.

Figure 7:
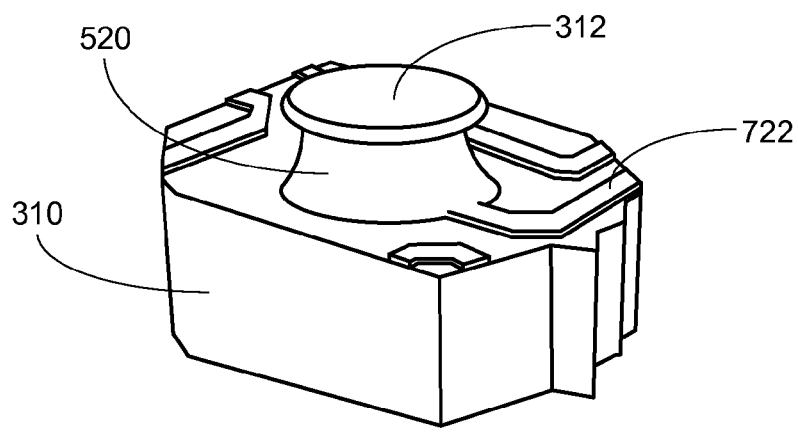
FIG. 7 is the structure of FIG. 6 in a first etching phase of manufacture.

Referring now to FIG. 7, therein is shown the structure of FIG. 6 in a first etching phase of manufacture. A mask or patterned etch resist layer (not shown) can be applied to the unplated leadframe 206 followed by an etching step to form traces 722, one of which is shown connected to one of the contact pads 520. The etching process can etch away a portion of the contact protrusions 208, forming the contact pads 520, such that the solder resist 312 overhangs the edge of the contact pads 520, which are smaller in diameter than the contact protrusions 208 as a result of the etching process. The mask or etch resist layer can then be removed, leaving the contact pads 520 and the traces 722 on the encapsulation 310.

In this example, only one of the contact pads 520 and a portion of the traces 722 are shown, though it is understood that there can be more of the contact pads 520, each connected to one or more of the traces 722, arranged in a regular or staggered array, for example. Each of the contact pads 520 can have curved sides as a result of the etching process. The use of the solder resist 312 can help control the size of the contact pads 520 better than pre-plated material could, because the solder resist 312 can resist the etching process better. If an anisotropic etching process is used, the diameter of the contact pads 520 can be defined by the diameter of the solder resist 312.

Figure 8:
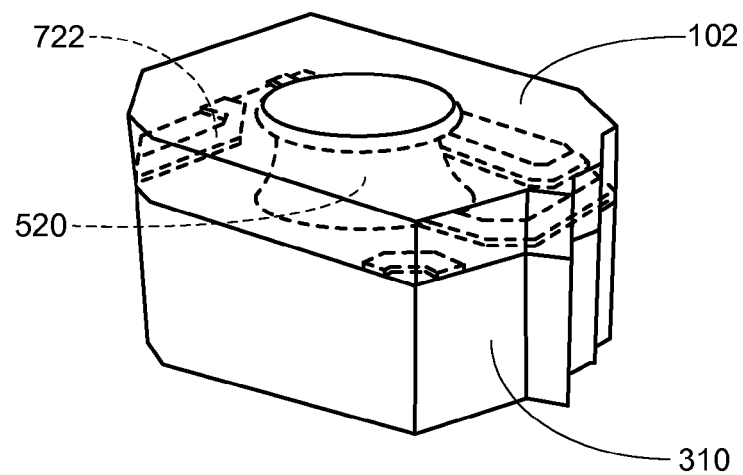
FIG. 8 is the structure of FIG. 7 in a trace protection phase of manufacture.

Referring now to FIG. 8, therein is shown the structure of FIG. 7 in a trace protection phase of manufacture. Following the removal of the mask or etch resist layer, the trace protection layer 102 can be applied to cover and directly contact the traces 722, most of each of the contact pads 520, and the side of the encapsulation 310 having the traces 722. Features covered by the trace protection layer 102 are shown with dotted lines. Dotted lead lines are used to point to features that are ordinarily not visible.

Figure 9A:
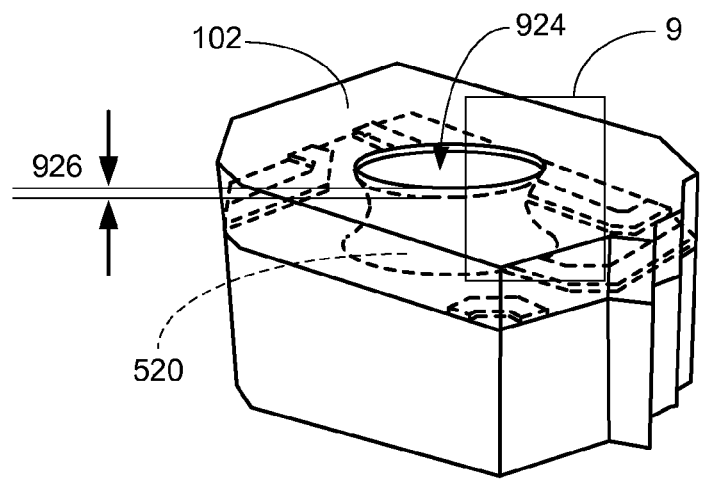
FIG. 9A is the structure of FIG. 8 in a second etching phase of manufacture.

Referring now to FIG. 9A, therein is shown the structure of FIG. 8 in a second etching phase of manufacture. After the application of the trace protection layer 102, a buffing step can be performed on the solder resist 312 of FIG. 6 and the top surface of the trace protection layer 102. For example, the buffing step can be a planarization process such as chemical mechanical planarization (CMP). The buffing step can remove the solder resist 312 and a portion of the trace protection layer 102 such that the top surface of the contact pads 520 is planar with the top surface of the trace protection layer 102.

The buffing step can be followed by a second etching step, which can remove the material of the contact pads 520 so as to form a recess 924 in the trace protection layer 102 wherein the top surface of the contact pads 520 is the bottom of the recess 924 and is a recess distance 926 below the top surface of the trace protection layer 102. The recess distance 926 is defined as the distance between the top surface of the trace protection layer 102 and the highest point of the top surface of the contact pads 520. In this example, the top surface of one of the contact pads 520 is shown as planar or flat, though it is understood that the top surface of the contact pads 520 can be concave or bowl-shaped due to an anisotropic etching method, with the central portion of the contact pads 520 lower than the outer edges. The etching process can leave the top surface of the contact pads 520 without defects and generally smooth.

Alternatively, the CMP process can be performed using a slurry selective for the material of the solder resist 312, removing only the solder resist 312 and not a significant amount of the trace protection layer 102. Dishing artifacts from the CMP process can leave the top surface of the contact pads 520 as concave. The selectivity of the process can form the recess 924 in the trace protection layer 102 and leave the top surface of the contact pads 520 the recess distance 926 below the top surface of the trace protection layer 102.

It has been discovered that using the solder resist 312 to protect the contact pads 520 during the first etching step instead of pre-plated material lowers cost and improves reliability. The removal of the solder resist 312 is easier than removal of plating, and reduces the chance of contamination and plating remnants causing connection problems when connecting to the contact pads 520.

It has also been discovered that the creation of the recess 924 can allow for finer pad pitch. The creation of the recess improves the ratio of the diameter of the top of the contact pads 520 to the base of the contact pads 520. The improved ratio allows for better lead spacing during processing, which can allow for finer pad pitch.

Figure 9B:
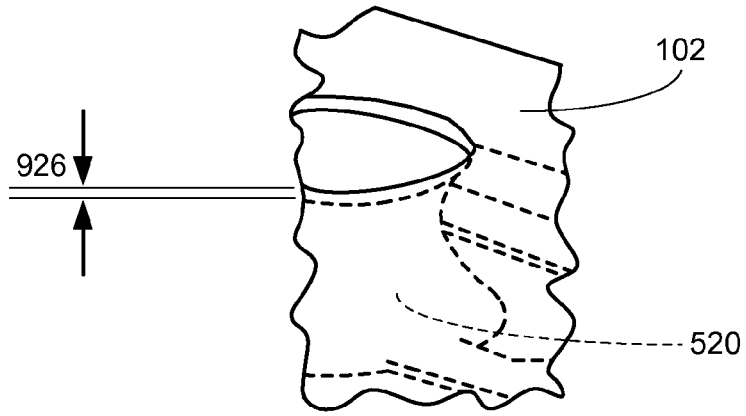
FIG. 9B is a detailed view of FIG. 9A within the inset depicted by the solid rectangle 9 of FIG. 9A.

Referring now to FIG. 9B, therein is shown a detailed view of FIG. 9A within the inset depicted by the solid rectangle 9 of FIG. 9A. In this view can be clearly seen one of the contact pads 520, the trace protection layer 102, and the recess distance 926 between them.

Figure 10:
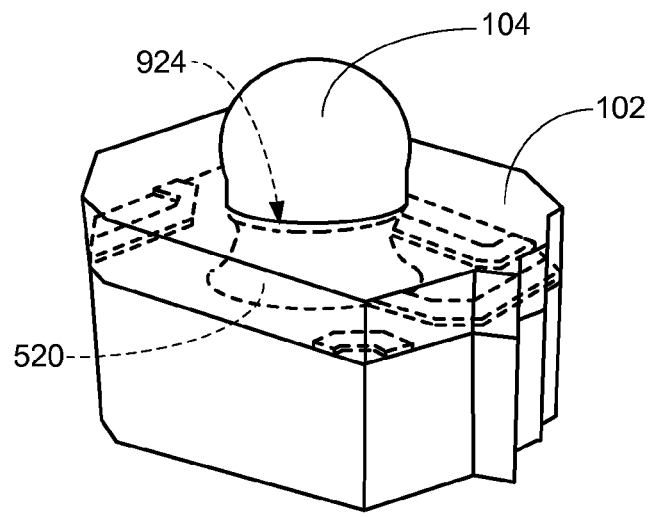
FIG. 10 is the structure of FIG. 9A in a ball attach phase of manufacture.

Referring now to FIG. 10, therein is shown the structure of FIG. 9A in a ball attach phase of manufacture. Following the second etching step to form the recess 924 in the trace protection layer 102, the external connectors 104 can be deposited directly in the recess 924, on the contact pads 520, and without using a solder-wettable plating layer. This can be followed by a reflow step where the external connectors 104, such as solder balls, are reflowed to fully cover the exposed surface of the contact pads 520 and fill the recess 924 in the trace protection layer 102. The contact pads 520 being recessed into the trace protection layer 102 can ensure a strong connection is maintained between the external connectors 104 and the contact pads 520 because the contact with the trace protection layer 102 can increase adhesion efficiency.

It has been discovered that the use of an unplated leadframe to form the recess 924 in the trace protection layer 102 increases reliability and product yield. So-called "mouse bite" defects can result from etchant residues etching small holes in surfaces they were not intended to etch. Because there is no need for a separate etching step to remove pre-plated material from the unplated leadframe 206 of FIG. 2, which can leave plating remnants and an uneven surface, there is zero occurrence of the mouse bite defects on the contact pads 520, and therefore better adhesion of the external connectors 104 to each of the contact pads 520, increasing reliability and yield.

Thus, it has been discovered that the integrated circuit packaging system 100 and method of manufacture of the present invention furnishes important and heretofore unknown and unavailable solutions, capabilities, and functional aspects for manufacturing packages using solder resist and without using plating.

Figure 11:
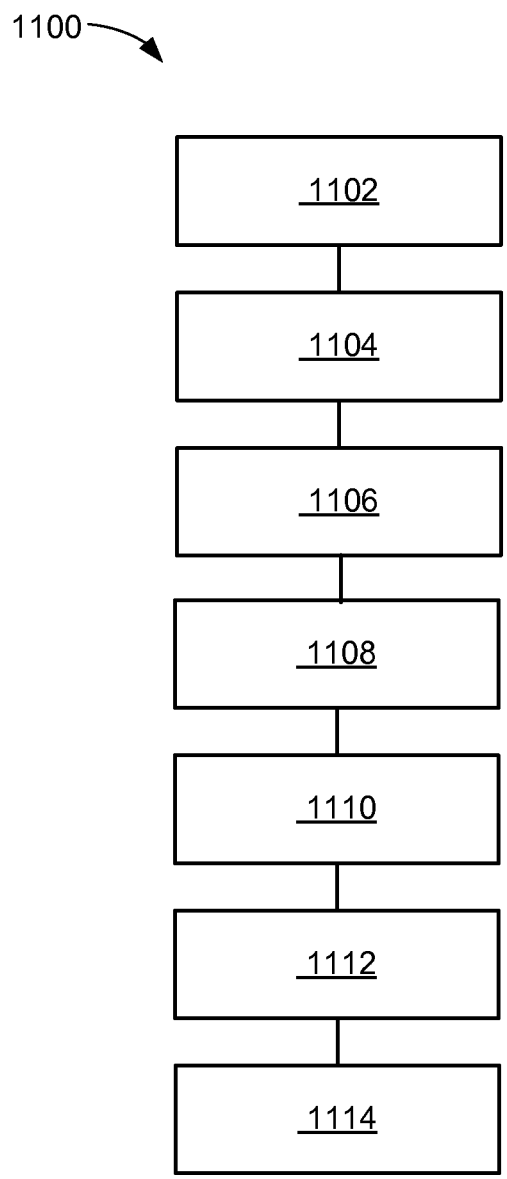
FIG. 11 is a flow chart of a method of manufacture of the integrated circuit packaging system in a further embodiment of the present invention.

Referring now to FIG. 11, therein is shown a flow chart of a method 1100 of manufacture of the integrated circuit packaging system 100 in a further embodiment of the present invention. The method 1100 includes: providing an unplated leadframe having a contact protrusion in a block 1102; depositing a solder resist on the contact protrusion in a block 1104; forming a contact pad and traces by etching the unplated leadframe in a block 1106; applying a trace protection layer on the contact pad and the traces in a block 1108; removing the solder resist in a block 1110; forming a recess in the trace protection layer by etching a top surface of the contact pad to a recess distance below a top surface of the trace protection layer in a block 1112; and depositing an external connector directly on the top surface of the contact pad in a block 1114.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
   providing an unplated leadframe having a contact protrusion;
   depositing a solder resist on the contact protrusion;
   forming a contact pad and traces by etching the unplated leadframe;
   applying a trace protection layer directly on the contact pad and the traces;
   removing the solder resist;
   forming a recess in the trace protection layer by etching a top surface of the contact pad to a recess distance below a top surface of the trace protection layer; and
   depositing an external connector directly on the top surface of the contact pad.

2. The method as claimed in claim 1 further comprising:
   connecting an integrated circuit die to the contact protrusion; and
   depositing an encapsulation on the integrated circuit die and the unplated leadframe.

3. The method as claimed in claim 1 wherein depositing the solder resist includes:
   providing on a dipping surface the solder resist; and
   dipping the contact protrusion into the solder resist.

4. The method as claimed in claim 1 wherein depositing the solder resist includes:
   positioning a patterned screen above the contact protrusion;

applying the solder resist through the patterned screen on the contact protrusion; and removing the patterned screen.

5. The method as claimed in claim 1 wherein depositing the solder resist includes:
applying the solder resist to a coating pin;
positioning the coating pin above the contact protrusion; and
pressing the solder resist on the contact protrusion by pressing the coating pin towards the contact protrusion.

6. A method of manufacture of an integrated circuit packaging system comprising:
providing an unplated leadframe having a contact protrusion;
connecting an integrated circuit die to the contact protrusion;
depositing an encapsulation on the integrated circuit die and the unplated leadframe;
depositing a solder resist on the contact protrusion;
forming a contact pad and traces by etching the unplated leadframe;
applying a trace protection layer directly on the contact pad and the traces;
removing the solder resist;
forming a recess in the trace protection layer by etching a top surface of the contact pad to a recess distance below a top surface of the trace protection layer; and
depositing an external connector directly on the top surface of the contact pad.

7. The method as claimed in claim 6 wherein etching the top surface of the contact pad includes etching the top surface of the contact pad without creating defects.

8. The method as claimed in claim 6 wherein removing the solder resist includes removing the solder resist and a portion of the trace protection layer with a buffing process.

9. The method as claimed in claim 6 wherein removing the solder resist includes removing the solder resist and a portion of the trace protection layer with chemical mechanical planarization.

10. The method as claimed in claim 6 wherein applying the trace protection layer includes applying the trace protection layer on the traces, the encapsulation, and the contact pad.

11. An integrated circuit packaging system comprising:
a contact pad;
traces connected to the contact pad;
a trace protection layer directly on the contact pad and the traces, the trace protection layer having a recess with a top surface of the contact pad a recess distance below a top surface of the trace protection layer; and
an external connector directly on the top surface of the contact pad.

12. The system as claimed in claim 11 further comprising:
an integrated circuit die connected to the contact pad; and
an encapsulation on the integrated circuit die and the contact pad.

13. The system as claimed in claim 11 wherein the contact pad and traces are formed from copper.

14. The system as claimed in claim 11 wherein the contact pad is without a plating layer.

15. The system as claimed in claim 11 wherein the external connector is in the recess.

16. The system as claimed in claim 11 further comprising:
an integrated circuit die connected to the contact pad; and
an encapsulation on the integrated circuit die and the contact pad;
wherein:
the contact pad is without a plating layer.

17. The system as claimed in claim 16 wherein the top surface of the contact pad is without defects.

18. The system as claimed in claim 16 wherein the contact pad has curved sides.

19. The system as claimed in claim 16 wherein the external connector is a solder ball.

20. The system as claimed in claim 16 wherein the trace protection layer is translucent.

* * * * *